(12) United States Patent
Yamazaki et al.

(10) Patent No.: US 6,417,543 B1
(45) Date of Patent: Jul. 9, 2002

(54) MIS SEMICONDUCTOR DEVICE WITH SLOPED GATE, SOURCE, AND DRAIN REGIONS

(75) Inventors: Shunpei Yamazaki, Tokyo; Yasuhiko Takemura, Kanagawa, both of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/641,559

(22) Filed: Aug. 18, 2000

Related U.S. Application Data

(62) Division of application No. 09/251,436, filed on Feb. 17, 1999, now Pat. No. 6,114,728, which is a division of application No. 08/721,537, filed on Sep. 26, 1996, now Pat. No. 5,891,766, which is a division of application No. 08/654,052, filed on May 28, 1996, now Pat. No. 5,736,750, which is a continuation of application No. 08/419,704, filed on Apr. 11, 1995, now abandoned, which is a division of application No. 08/181,906, filed on Jan. 18, 1994, now Pat. No. 5,523,257.

(30) Foreign Application Priority Data

| Jan. 18, 1993 | (JP) | ................................. 5-23286 |
| Jan. 18, 1993 | (JP) | ................................. 5-23288 |

(51) Int. Cl.$^7$ .............................................. H01L 29/00
(52) U.S. Cl. ..................... 257/347; 257/348; 257/350; 257/351; 257/354
(58) Field of Search ................................. 257/347, 355, 257/55–65

(56) References Cited

U.S. PATENT DOCUMENTS

| 4,143,388 | A | | 3/1979 | Esaki et al. .................. 257/327 |
| 4,394,182 | A | * | 7/1983 | Maddox ....................... 148/147 |
| 4,469,568 | A | | 9/1984 | Kato et al. .................. 204/35.1 |
| 4,719,183 | A | | 1/1988 | Maekawa ....................... 437/21 |
| 4,727,044 | A | | 2/1988 | Yamazaki ...................... 437/45 |
| 4,751,193 | A | | 6/1988 | Myrick ........................ 437/21 |
| 4,933,298 | A | | 6/1990 | Hasegawa ..................... 437/173 |
| 4,997,780 | A | | 3/1991 | Szluk et al. ................. 437/173 |
| 5,177,577 | A | | 1/1993 | Taniguchi et al. |
| 5,183,780 | A | | 2/1993 | Noguchi et al. ............. 437/173 |
| 5,252,502 | A | | 10/1993 | Haveman ...................... 437/21 |
| 5,258,645 | A | | 11/1993 | Sato |
| 5,289,030 | A | | 2/1994 | Yamazaki et al. ........... 257/410 |
| 5,306,651 | A | | 4/1994 | Masumo et al. ............ 437/173 |
| 5,308,998 | A | | 5/1994 | Yamazaki et al. ............. 257/57 |
| 5,323,047 | A | | 6/1994 | Nguyen ...................... 257/774 |
| 5,334,544 | A | | 8/1994 | Matsuoka et al. ............ 437/40 |
| 5,359,206 | A | | 10/1994 | Yamamoto et al. |
| 5,501,989 | A | | 3/1996 | Takayama et al. ............ 437/21 |
| 5,523,257 | A | | 6/1996 | Yamazaki et al. |
| 5,585,290 | A | | 12/1996 | Yamamoto et al. |
| 5,585,949 | A | | 12/1996 | Yamazaki et al. |

(List continued on next page.)

FOREIGN PATENT DOCUMENTS

| EP | 0 474 474 | 3/1992 |
| JP | 55-016433 | 2/1980 |
| JP | 57-170571 | 10/1982 |

(List continued on next page.)

*Primary Examiner*—Fetsum Abraham
(74) *Attorney, Agent, or Firm*—Nixon Peabody LLP; Jeffrey L. Costellia

(57) ABSTRACT

The invention is concerned with the fabrication of a MIS semiconductor device of high reliability by using a low-temperature process. Disclosed is a method of fabricating a MIS semiconductor device, wherein doped regions are selectively formed in a semiconductor substrate or a semiconductor thin film, provisions are then made so that laser or equivalent high-intensity light is radiated also onto the boundaries between the doped regions and their adjacent active region, and the laser or equivalent high-intensity light is radiated from above to accomplish activation.

24 Claims, 11 Drawing Sheets

U.S. PATENT DOCUMENTS

| | | | |
|---|---|---|---|
| 5,620,905 A | 4/1997 | Konuma et al. | 438/163 |
| 5,637,187 A | 6/1997 | Takasu et al. | |
| 5,672,523 A | 9/1997 | Yamamoto et al. | |
| 5,677,207 A | 10/1997 | Ha | 437/21 |
| 5,696,394 A | 12/1997 | Jones, Jr. et al. | |
| 5,719,408 A | 2/1998 | Yamamoto et al. | |
| 5,736,414 A | 4/1998 | Yamaguchi | 437/21 |
| 5,736,750 A | 4/1998 | Yamazaki et al. | |
| 5,770,486 A | 6/1998 | Zhang et al. | 438/163 |
| 5,786,241 A | 7/1998 | Shimada | 438/163 |
| 5,789,284 A | 8/1998 | Yamazaki et al. | 438/166 |
| 5,834,328 A * | 11/1998 | Jang | 438/155 |
| 5,889,573 A | 3/1999 | Yamamoto et al. | |
| 5,891,766 A | 4/1999 | Yamazaki et al. | |
| 6,004,831 A | 12/1999 | Yamazaki et al. | |
| 6,060,725 A * | 5/2000 | Zhang et al. | 257/66 |
| 6,067,062 A | 5/2000 | Takasu et al. | |

FOREIGN PATENT DOCUMENTS

| | | | |
|---|---|---|---|
| JP | 58-106861 | 6/1983 | |
| JP | 58-115864 | 7/1983 | 257/66 |
| JP | 58-206121 | 12/1983 | |
| JP | 59-029289 | 2/1984 | |
| JP | 59-161049 | 9/1984 | 257/774 |
| JP | 60-54478 | 3/1985 | |
| JP | 60-127761 | 7/1985 | |
| JP | 61-142769 | 6/1986 | |
| JP | 61-251064 | 11/1986 | 257/300 |
| JP | 62-120081 | 6/1987 | |
| JP | 62-271420 | 11/1987 | |
| JP | 63-131576 | 6/1988 | |
| JP | 63-208225 | 8/1988 | |
| JP | 64-22057 | 1/1989 | |
| JP | 1-128575 | 5/1989 | |
| JP | 01-205569 | 8/1989 | |
| JP | 1-248555 | 10/1989 | |
| JP | 02-044769 | 2/1990 | |
| JP | 02-052438 | 2/1990 | |
| JP | 02-194626 | 8/1990 | |
| JP | 02-222545 | 9/1990 | |
| JP | 02-224255 | 9/1990 | |
| JP | 02-137035 | 11/1990 | |
| JP | 2-277230 | 11/1990 | 257/774 |
| JP | 3-21024 | 1/1991 | 257/774 |
| JP | 3-165575 | 7/1991 | 257/66 |
| JP | 3-232274 | 10/1991 | |
| JP | 3-270163 | 12/1991 | |
| JP | 03-274029 | 12/1991 | |
| JP | 4-10662 | 1/1992 | 257/316 |
| JP | 4-65168 | 3/1992 | |
| JP | 04-124813 | 4/1992 | |
| JP | 04-133035 | 5/1992 | |
| JP | 04-260336 | 9/1992 | |
| JP | 04-295826 | 10/1992 | |
| JP | 04-305939 | 10/1992 | |
| JP | 04-360580 | 12/1992 | |
| JP | 04-360581 | 12/1992 | |
| JP | 04-365016 | 12/1992 | |
| JP | 05-061057 | 3/1993 | |
| JP | 06-021038 | 1/1994 | |
| JP | 06-216156 | 8/1994 | |
| JP | 06-216157 | 8/1994 | |

* cited by examiner

LASER LIGHT

LASER LIGHT

MIS SEMICONDUCTOR DEVICE WITH SLOPED GATE, SOURCE, AND DRAIN REGIONS

This application is a Division of Application Ser. No. 09/251,436 filed Feb. 17, 1999 now U.S. Pat. No. 6,114,728; which itself is a Division of Ser. No. 08/721,537 filed Sep. 26, 1996, now U.S. Pat. No. 5,891,766; which is a Division of Ser. No. 08/654,052 filed May 28, 1996, now U.S. Pat. No. 5,736,750; which is a Continuation of Ser. No. 08/419,704 filed Apr. 11, 1995, abandoned; which is a Division of Ser. No. 08/181,906 filed Jan. 18, 1994, now U.S. Pat. No. 5,523,257.

BACKGROUND OF THE INVENTION

1. Field of the Invention

The present Invention relates to a metal(M)-insulator(I) semiconductor(s) device generally known as a MIS semiconductor device (also known as an insulated-gate semiconductor device). Such MIS semiconductor devices include, for example, MOS transistors, thin-film transistors, and the like.

2. Description of the Prior Art

In the prior art, MIS semiconductor devices have been fabricated using self-alignment techniques. According to such techniques, a gate electrode is formed on a semiconductor substrate or a semiconductor film with a gate insulating film interposed therebetween, and using the gate electrode as a mask, impurities are introduced into the semiconductor substrate or the semiconductor film. Thermal diffusion, ion implantation, plasma doping, and laser doping are typical methods of introducing impurities. With self-alignment techniques, the edges of the impurity doped regions (source and drain) can be substantially aligned with the edges of the gate electrode, eliminating the overlap between the gate electrode and the doped regions (that could give rise to the formation of parasitic capacitances) as well as the offset that causes separation between the gate electrode and the doped regions (that could reduce effective mobility).

The prior art process, however, has had the problem that the spatial carrier concentration gradient between the doped regions and their adjacent active region (channel forming region) formed below the gate electrode is too steep, thus causing an extremely high electric field and increasing, in particular, the leakage current (OFF current) when a reverse bias is applied to the gate electrode.

To address such a problem, the present inventor et al. have found that an improvement can be made by slightly offsetting the gate electrode with respect to the doped regions, and also that an offset of 300 nm or less can be obtained with good reproducibility by forming the gate electrode from an anodizable material and by introducing impurities by using the resulting anodic oxide film also as a mask.

Furthermore, in the case of ion implantation, plasma doping and other methods that involve driving high-velocity ions into a semiconductor substrate or a semiconductor film to introduce impurities, the crystallinity of the semiconductor substrate or film needs to be improved (activation) since the crystallinity of the structure where ions are driven is damaged by the penetrating ions. In the prior art, it has been practiced to improve the crystallinity by thermal means using temperatures of 600° C. or higher, but according to the recent trend, lower process temperatures are demanded. In this view, the present inventor et al. have also shown that the activation can be accomplished by using laser or equivalent high-intensity light and that such activation has significant advantages for mass production.

FIG. 2 shows a fabrication process sequence for a thin-film transistor based on the above concept. First, a base insulating film 202 is deposited over a substrate 210, and a crystalline semiconductor region 203 is formed in the shape as an island, over which an insulating film 204 that acts as a gate insulating film is formed. Then, a gate connection 205 is formed using an anodizable material. (FIG. 2(A))

Next, the gate connection is anodized to form an anodic oxide film 206 to a thickness of 300 nm or less, preferably 250 nm or less, on the surface of the gate connection. Using this anodic oxide as a mask, impurities (for example, phosphorous (P)) are driven by using a method such as ion implantation or ion doping to form impurity doped regions 207. (FIG. 2(B))

Thereafter, high-intensity light such as laser light is radiated from above to activate the regions where the impurities have been introduced. (FIG. 2(C))

Finally, an inter-layer insulator 208 is deposited, contact holes are opened over the doped regions, and electrodes 209 are formed for connection to the doped regions, thus completing the fabrication of the thin-film transistor. (FIG. 2(D))

However, it has been found that in the above-described process, the boundaries (indicated by X in FIG. 2(C)) between the doped regions and the active region (the semiconductor region directly below the gate and flanked by the doped regions) are unstable, and that the reliability decreases due to increased leakage current, etc. after use for long periods of time. That is, as can be seen from the process, the crystallinity of the active region remains substantially unchanged throughout the process; on the other hand, the doped regions adjacent to the active region initially have the same crystallinity as that of the active region but their crystallinity is damaged during the process of impurity introduction. The doped regions are repaired in the subsequent laser radiation step, but it is difficult to restore the original crystallinity. Furthermore, it has been found that in particular, the portions of the doped regions that contact the active region cannot be activated sufficiently as such portions tend to remain unexposed to laser radiation. This results in discontinuity in the crystallinity between the doped regions and the active region, tending to cause trapping states, etc. In particular, when impurities are introduced using a method that involves driving high-velocity ions, the impurity ions are caused to scatter and penetrate into regions below the gate electrode, so that the crystallinity of these regions is damaged. It has not been possible to activate such regions lying below the gate electrode by laser or other light since they are in the shadow of the gate electrode.

One way to solve this problem is to radiate laser or other light from the reverse side to activate these regions. In this method, the boundaries between the active region and the doped regions can be activated sufficiently since the light is not blocked by the gate connection. This method, however, requires that the substrate material be transparent to light, and as a matter of course, cannot be employed when a silicon wafer or the like is used as the substrate. Furthermore, most glass materials do not easily transmit ultraviolet light of wavelength below 300 nm; therefore, KrF excimer lasers (wavelength 248 nm), for example, that achieve excellent mass productivity cannot be used.

SUMMARY OF THE INVENTION

In view of the above problems, it is an object of the present invention to provide a MIS semiconductor device, such as a MOS transistor and thin-film transistor, wherein device reliability is enhanced by achieving continuity in the crystallinity between the active and doped regions.

In the present invention, provisions are made so that when light energy emitted from a high-intensity light source such as a laser or a flash lamp is projected onto impurity doped regions from above for activation thereof, not only the doped regions but also a part of an active region adjacent thereto, in particular, the boundaries between the active region and the doped regions, are exposed to the light energy. To achieve the purpose, a portion of a material forming a gate electrode is removed.

According to a first mode of the invention, the process comprises: a step in which a material that acts as a mask for the formation of doped regions is formed over a crystalline semiconductor substrate or semiconductor film, and then, using this material as the mask, impurities are introduced into the semiconductor substrate or semiconductor film; a step in which the masking material is removed so that light energy can be projected onto both the doped and active regions, and in this condition, the light energy is projected for activation; and a step in which a gate electrode (gate connection) is formed on the active region.

When this process is employed, if an offset region is to be formed, the mask pattern for the formation of the doped regions needs to made larger in width than the gate electrode pattern. If the gate electrode pattern were made larger in width than the mask pattern for impurity injection, the resulting gate electrode would overlap the doped regions.

Furthermore, it is difficult to precisely place masks at the same place in different steps when different photo masks are used. In particular, it is almost impossible to realize the offset condition of 1 $\mu$m or less, as required by the invention, in mass production. On the other hand, overlaying by using the same photo mask is relatively easy. Suppose, for example, that by using a certain photo mask, a connection pattern is formed, and then by using this pattern as a mask, impurity doped regions are formed, followed by the removal of the connection. When this same photo mask is used to form a connection subsequently, almost no offset is produced. However, by anodizing the surface of the connection after that, the conductive surface of the connection recedes and the desired offset is achieved.

On the other hand, if the first formed connection is anodized, the surface of the resulting anodic oxide advances; if doped regions are formed using this anodized connection as a mask, the doped regions are formed outwardly of the initially formed connection pattern. Then, by anodizing the second connection, the conductive surface of the connection recedes and the offset is increased.

Thus, by forming the gate electrode from an anodizable material and then anodizing the gate electrode, the desired offset can be obtained with relative ease. It will be recognized that the resulting anodic oxide also serves to prevent shorting between layers. It will also be appreciated that the gate electrode (connection) may be covered with an inter-layer insulator or the like, in addition to the anodic oxide, to reduce the capacitive coupling with upper connections.

According to a second mode of the invention, the process comprises: a step in which an insulating film that acts as a gate insulating film is formed on a crystalline semiconductor substrate or semiconductor film, and then by using the insulating film as a mask, impurities are introduced in self-aligned fashion into the semiconductor substrate or semiconductor film; and a step in which ends of a gate electrode are selectively etched so that the gate electrode is offset with respect to impurity doped regions and so that light energy can be projected onto the boundaries between the doped and active regions, and in this condition, the light energy is projected for activation.

Preferably, the gate electrode is formed from an anodizable material, and after exposure to the light energy, the gate electrode is anodized to cover its surface with a high-resistance anodic oxide, which is further covered with an inter-layer insulator or the like to reduce the capacitive coupling with upper connections.

According to a third mode of the invention, the process comprises: a step in which an insulating film that acts as a gate insulating film is formed on a crystalline semiconductor substrate or semiconductor film, followed by the formation of a gate connection (gate electrode) using an appropriate material, and then by using the gate connection as an electrode, the surface of the electrode is electrochemically coated with a conductive material or the like by an electrochemical reaction (e.g., electroplating); a step in which impurities are introduced in self-aligned fashion into the semiconductor substrate or semiconductor film by using the thus processed gate electrode region (the gate electrode and the conductive material deposited on its surface) as a mask; and a step in which part or whole of the previously deposited material is removed so that light energy can be projected onto the boundaries between the doped and active regions, and in this condition, the light energy is projected for activation.

Preferably, the gate electrode is formed from an anodizable material, and after exposure to the light energy, the gate electrode is anodized to cover its surface with a high-resistance anodic oxide, which is further covered with an inter-layer insulator or the like to reduce the capacitive coupling with upper connections.

Anodizable materials preferable for use in the present invention include aluminum, titanium, tantalum, silicon, tungsten, and molybdenum. These materials may be used singly or in alloy form to form a gate electrode of a single layer or multilayer structure. It will be recognized that a minute amount of other elements may be added to the above materials. For anodic oxidation, a wet process is commonly employed in which oxidation is carried out in an electrolyte, but it will be appreciated that a known plasma anodic oxidation method (oxidation in a reduced-pressure plasma atmosphere) may be employed. It will be further appreciated that the oxidation process is not limited to anodic oxidation but that other suitable oxidation methods may be used.

Sources for light energy suitable for use in the present invention include: excimer lasers such as KrF lasers (wavelength 248 nm), XeCl lasers (308 nm), ArF lasers (193 nm), XeF lasers (353 nm), etc.; Nd:YAG lasers (1064 nm) and its second, third, and fourth harmonics; coherent light sources such as carbon dioxide gas lasers, argon ion lasers, copper vapor lasers, etc.; and incoherent light sources such as xenon flash lamps, krypton arc lamps, etc.

The MIS semiconductor device fabricated by the above process is characterized in that, when viewed from the top, the junctions of the doped regions (source and drain) and the gate electrode region (including the gate electrode and its associated anodic oxide) are essentially the same in shape (similar form), and that the gate electrode (defined by its conductive surface and excluding its associated anodic oxide) is offset with respect to the doped regions.

When the gate electrode has no oxide, such as anodic oxide, formed thereon, there is no oxide formed around the gate electrode, and the gate electrode is offset with respect to the doped regions, the width of the offset preferably being 0.1 to 0.5 $\mu$m.

In the present invention, it is also possible to control the thicknesses of individual oxides such as anodic oxides formed on the same substrate by adjusting, for example, the applied voltage for each connection. In this case, the thickness of the oxide formed part of the gate electrode region and the thickness of the oxide forming part of a capacitor (or a portion at an intersection between connections) may be set independently of each other to appropriate values that suit their respective purposes.

DESCRIPTION OF THE PREFERRED EMBODIMENTS

[Embodiment 1]

Figure 1A:
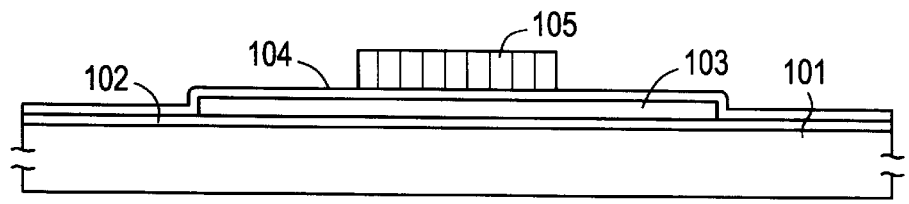
FIGS. 1(A) to 1(E) show an embodiment of the present invention. (Cross-sectional views)
Figure 1B:
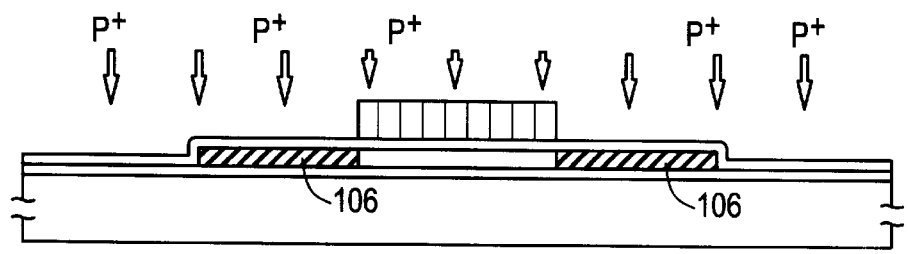

FIG. 1 shows the process according to this embodiment. This embodiment is concerned with the fabrication of a thin-film transistor on an insulating substrate. The substrate 101 shown is formed from glass; no-alkali glass, such as Coning 7059, or quartz or the like can be used to form the substrate. In this embodiment, a Coning 7059 substrate was used in consideration of the cost. A silicon oxide film 102 as the base oxide film was deposited over the substrate. Sputtering or chemical vapor deposition (CVD) techniques can be used to deposit the silicon oxide film. In this embodiment, deposition of this film was performed by plasma CVD using tetraethoxysilane (TEOS) and oxygen as the material gas. The substrate was heated to temperatures 200 to 400° C. The silicon oxide base film was deposited to a thickness of 500 to 2000 Å.

Next, an amorphous silicon film was deposited and patterned into an island shape. Plasma CVD and low-pressure CVD techniques are commonly used to deposit such an amorphous silicon film. In this embodiment, the amorphous silicon film was deposited by plasma CVD using monosilane (SiH$_4$) as the material gas. The amorphous silicon film was deposited to a thickness of 200 to 700 Å. This film was exposed to the radiation of laser light (KrF laser of wavelength 248 nm and pulse width 20 nsec). Prior to the laser radiation, the substrate was heated for 0.1 to 3 hours at temperatures 300 to 550° C. in a vacuum to extract the hydrogen contained in the amorphous silicon film. The laser's energy density was 250 to 450 mJ/cm$^2$. The substrate was held at temperatures 250 to 550° C. during the laser radiation. As a result, the amorphous silicon film was crystallized, resulting in the formation of a crystalline silicon film 103.

Next, a silicon oxide film 104 that was to act as a gate insulating film was formed to a thickness of 800 to 1200 Å. In this embodiment, deposition of this film was accomplished by using the same method as employed for the formation of the silicon oxide base film 102. Then, a masking material 105 was applied, which is usually made from an organic material such as polyimide, conductive material such as aluminum, tantalum, titanium, or other metal, semiconductor such as silicon, or conductive metallic nitride such as tantalum nitride or titanium nitride. In this embodiment, a photosensitive polyimide was used to form the masking material 105 having a thickness of 2000 to 10000 Å. (FIG. 1(A))

Then, using a plasma doping technique, boron (B) or phosphorus (P) ions were driven to form doped regions 106. The acceleration energy of the ions is usually set to match the thickness of the gate insulating film 104; typically, for the gate insulating film of 1000 Å thickness, appropriate acceleration energy was 50 to 65 keV for boron and 60 to 80 keV for phosphorus. A dose of $2\times10^{14}$cm$^{-2}$ to $6\times10^{15}$cm$^{-2}$ was found appropriate, and it was also found that at lower doses, a device of higher reliability can be obtained. The profiles of the doped regions shown in the figure are only for illustrative purposes, and it is to be understood that in actuality the regions extend more or less outside the illustrated profiles because of ion scattering, etc. (FIG. 1(B))

Figure 1C:
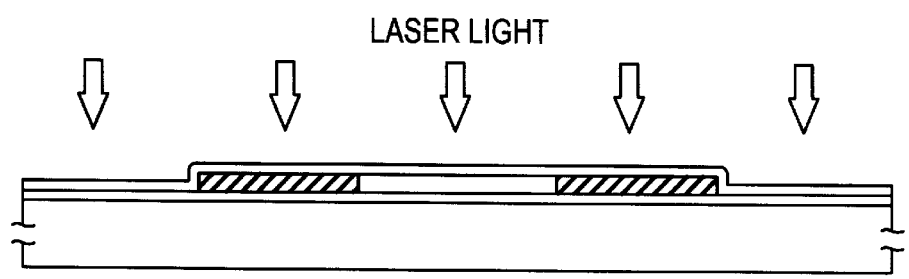
Figure 1D:
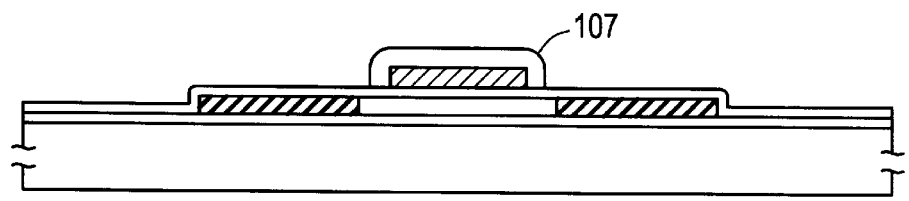
Figure 1E:
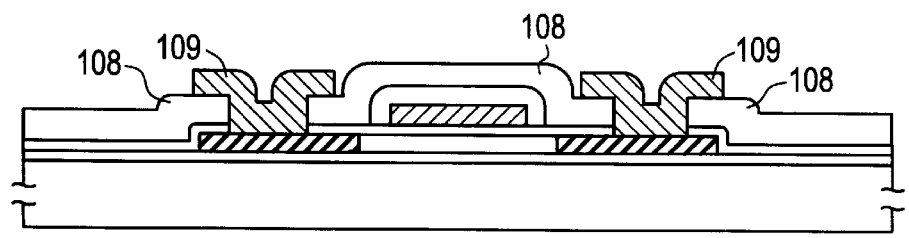
Figure 2A:
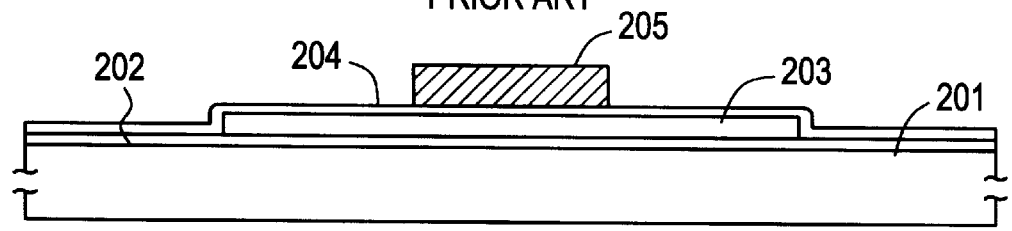
FIGS. 2(A) to 2(D) show an embodiment according to the prior art. (Cross-sectional views)
Figure 2B:
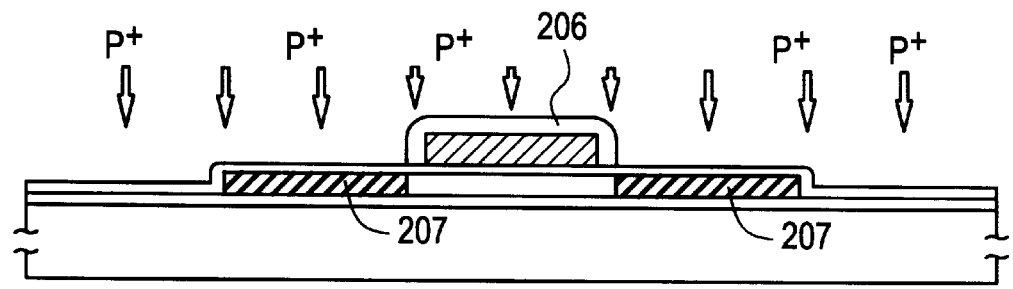
Figure 2C:
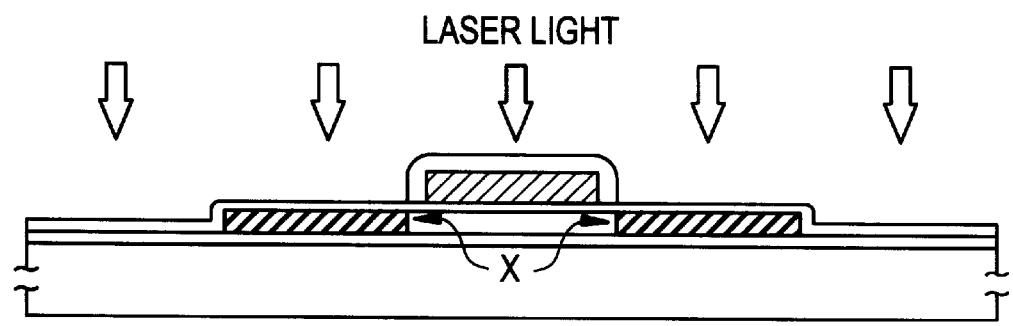
Figure 2D:
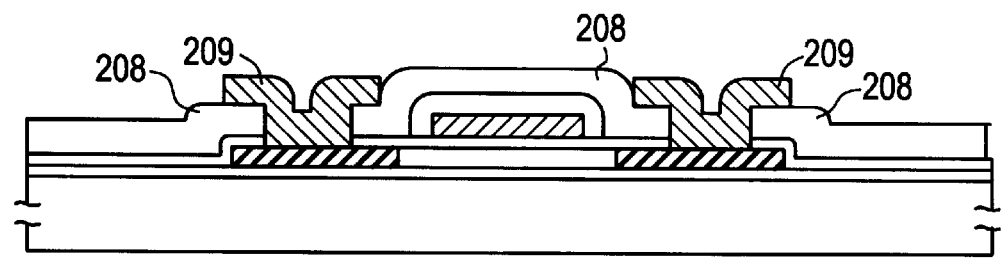
Figure 3A:
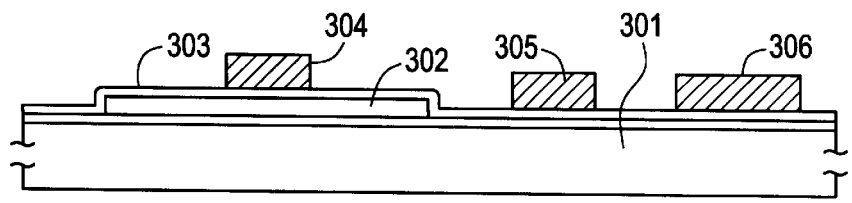
FIGS. 3(A) to 3(F) show an embodiment of the present invention. (Cross-sectional views)
Figure 3B:
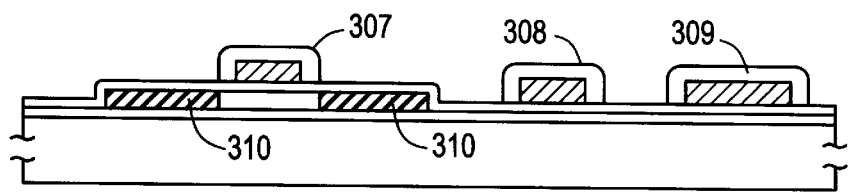
Figure 3C:
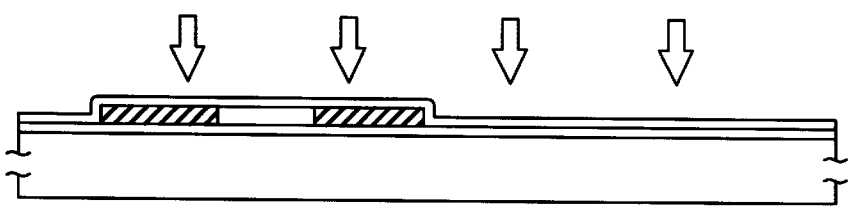
Figure 3D:
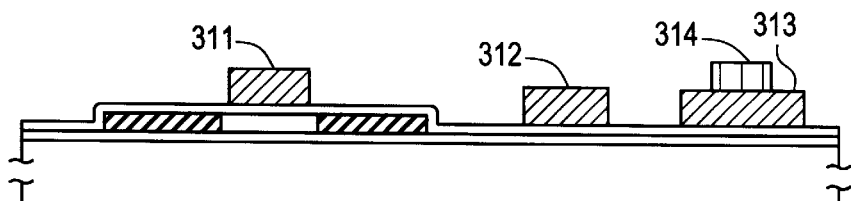
Figure 3E:
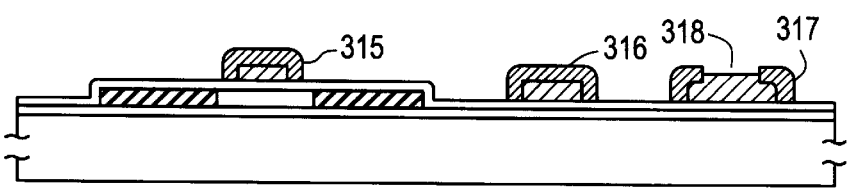
Figure 3F:
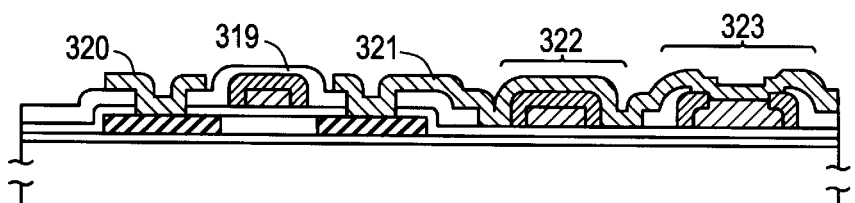

After the impurity doping was completed, the polyimide masking material 105 was etched away. The etching was performed in an oxygen plasma atmosphere. As a result, the doped regions 106 and an active region flanked by them were revealed as shown in FIG. 1(C). In this condition, laser radiation was performed to activate the doped regions. The laser used was a KrF excimer laser (wavelength 248 nm, pulse width 20 nsec), and the laser's energy density was 250 to 450 mJ/cm$^2$. More effective activation was obtained by holding the substrate at temperatures 250 to 550° C. during the laser radiation. Typically, for phosphorus-doped regions, a sheet resistance of 500 to 1000 Ω/cm$^2$ was obtained with a dose of $1\times10^{15}$cm$^{-2}$, substrate temperature of 250° C., and laser energy of 300 mJ/cm$^2$. Furthermore, in this embodiment, since the boundaries between the doped regions and the active region are also exposed to laser radiation, the prior art fabrication problem of reduced reliability due to the degradation of the boundary portions is drastically alleviated. (FIG. 1(C))

After that, a tantalum gate electrode (connection) having a width 0.2 μm narrower than the masking material 105 was formed by patterning, and electric current was applied to the gate electrode to perform anodic oxidation to form an anodic oxide of 1000 to 2500 Å thickness. To achieve the anodic oxidation, the substrate was immersed in an ethylene glycol solution of 1–5% citric acid, and all gate electrodes were combined to form the positive electrode while a platinum was used to form the negative electrode; in this condition, the applied voltage was increased at a rate of 1 to 5 volts per minute. The thus formed gate electrode 107 was clearly in an offset condition with respect to the doped regions. The anodic oxide produced on the gate electrode not only determines the amount of the offset of the thin-film transistor but also serves to prevent shorting to upper connections; therefore, it is only necessary for the oxide to have the thickness that can achieve the purpose, and depending on cases, the formation of such an anodic oxide may not be necessary. (FIG. 1(D))

Finally, a silicon oxide film 108 as an inter-layer insulator was formed to a thickness of 2000 to 1000 Å by plasma CVD using, for example, TEOS as the material gas, and this film was opened in a window pattern, through which electrodes 109, each consisting of a multilayer film of metal or other materials e.g. a multilayer film comprising a titanium nitride of 200 Å thickness and an aluminum of 5000 Å thickness, were formed for connection to the doped regions, thus completing the fabrication of the thin-film transistor. (FIG. 1(E))

[Embodiment 2]

Figure 4A:
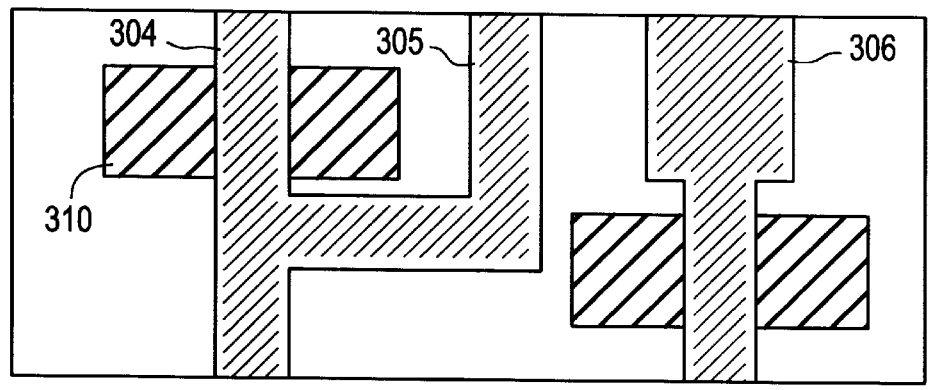
FIGS. 4(A) to 4(C) show an embodiment of the present invention. (Top plan views)
Figure 4B:
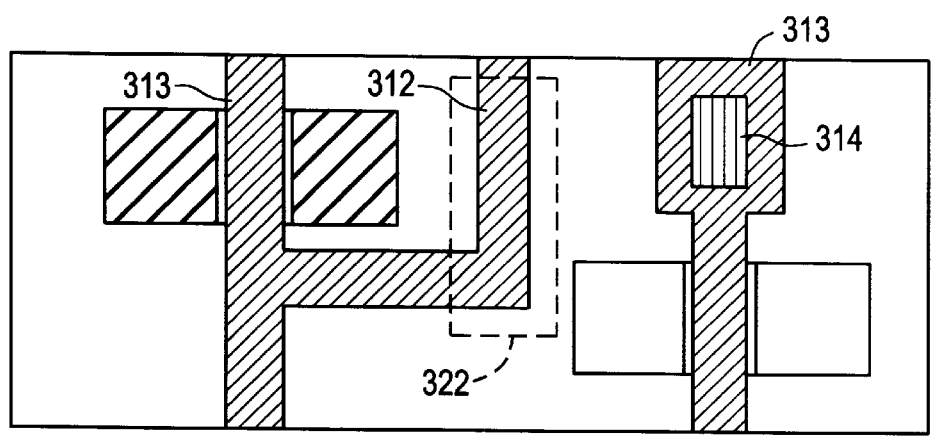
Figure 4C:
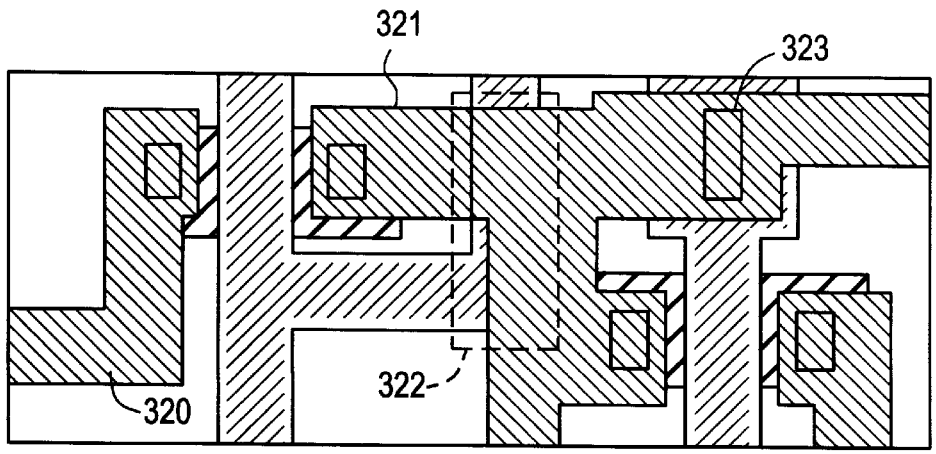
Figure 5A:
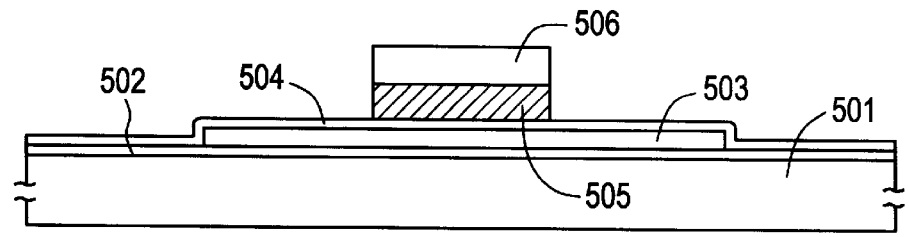
FIGS. 5(A) to 5(E) show an embodiment of the present invention. (Cross-sectional views)
Figure 5B:
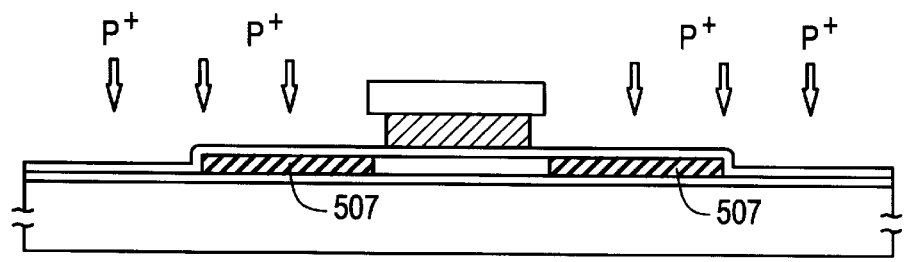
Figure 5C:
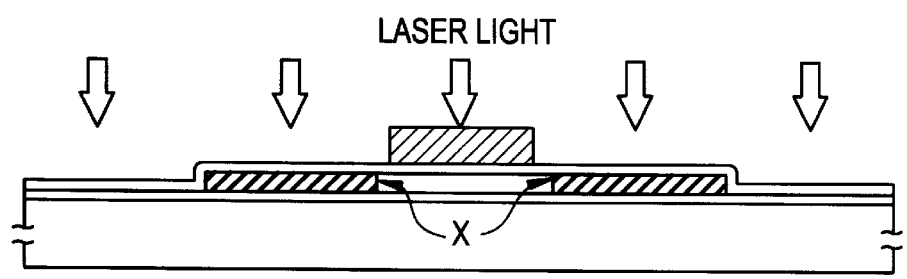
Figure 5D:
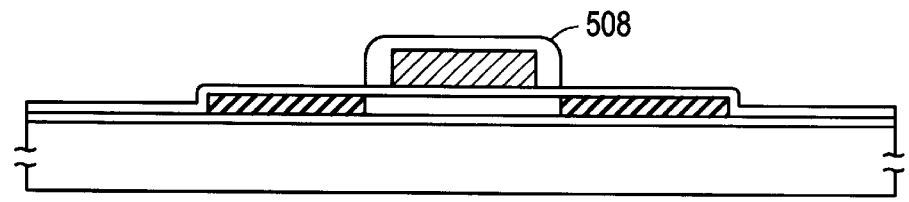
Figure 5E:
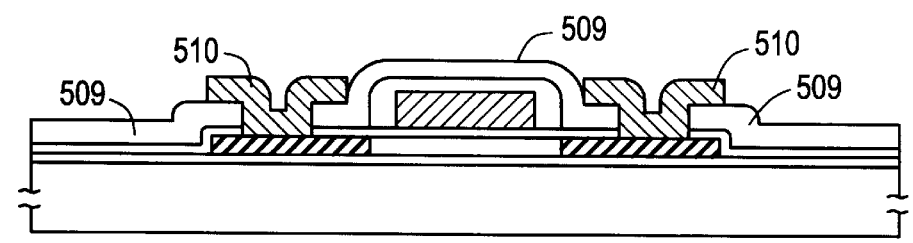
Figure 6A:
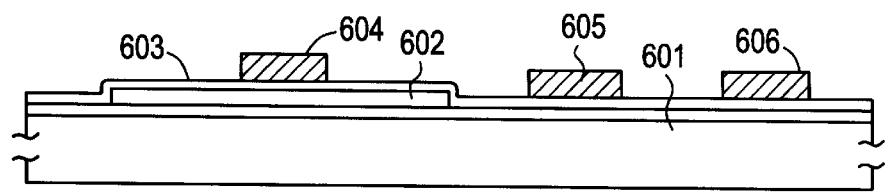
FIGS. 6(A) to 6(F) show an embodiment of the present invention. (Cross-sectional views)
Figure 6B:
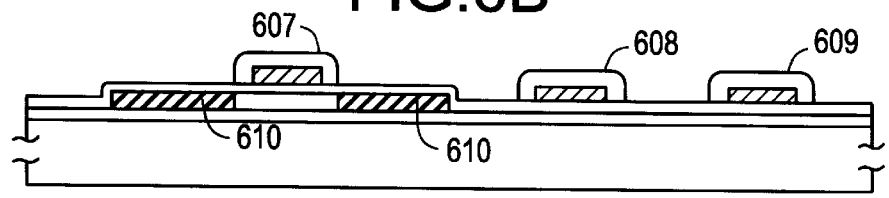
Figure 6C:
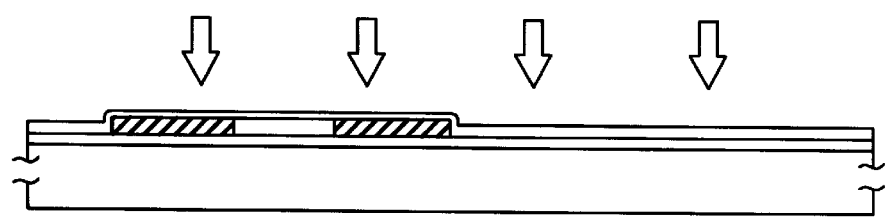
Figure 6D:
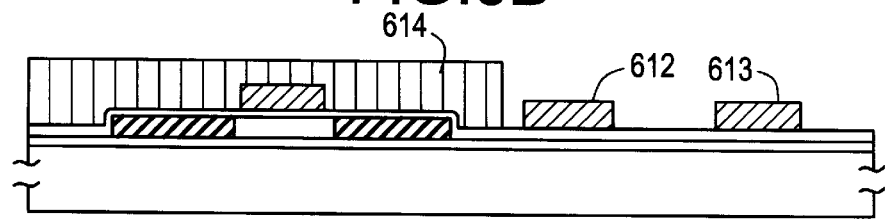
Figure 6E:
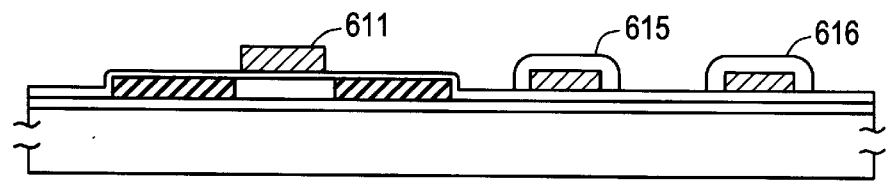
Figure 6F:
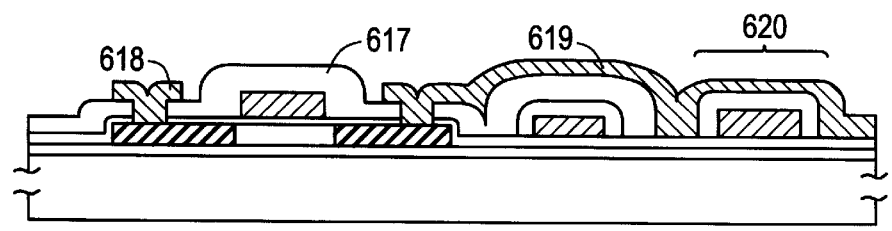

FIGS. 3 and 4 show the process according to this embodiment. FIG. 3 is a cross-sectional view taken along a dashed line in FIG. 4 (top plan view). First, a silicon oxide base film was formed over a substrate (Coning 7059) 301, and an amorphous silicon film was formed to a thickness of 1000 to 1500 Å. Then, annealing was performed for 24 to 48 hours at 600° C. in a nitrogen or argon atmosphere, to crystallize the amorphous silicon which was then patterned. An island of crystalline silicon 302 was thus formed. Further, a silicon oxide film 303 that was to act as a gate insulating film was deposited to a thickness of 1000 Å, on which were formed tantalum connections (thickness 5000 Å) 304, 305, and 306. (FIG. 3(A))

Next, electric current was applied to these connections 304 to 306 to form first anodic oxides of 2000 to 2500 Å thickness, 307, 308, and 309, over their surfaces. Using the thus processed connections as a mask, impurities were introduced into the silicon film 302 by plasma doping to form doped regions 310. (FIGS. 3(B) and 4(A))

Next, the above processed tantalum connections and the anodic oxides were removed to expose the surfaces of active regions. In this condition, KrF excimer laser light was radiated to perform activation. (FIG. 3(C))

After that, the exactly same pattern (connections 311, 312, 313) as the previous connections 304 to 306 was formed using tantalum. A polyimide film 314 of 1 to 5 μm thickness was formed only on the portion of the connection 313 where a contact hole was to be formed. For the polyimide, a photosensitive polyimide material is preferable for use because of ease of patterning. (FIGS. 3(D) and 4(B))

In this condition, electric current was applied to the connections 311 to 313 to form second anodic oxides of 2000 to 2500 Å thickness, 315, 316, and 317. However, the portion on which the polyimide was previously formed was not anodized but left with a contact hole 318. (FIG. 3(E))

Finally, a silicon oxide film 319 of 2000 to 5000 Å thickness was deposited as an inter-layer insulator, through which contact holes were opened. The inter-layer insulator deposited on a portion of the connection 312 (the portion inside the dotted line 322 in FIG. 4(C)) was completely removed to expose the underlying second anodic oxide 316. Then, connections/electrodes 320 and 321 each consisting of a multilayer film of tantalum nitride (thickness 500 Å) and aluminum (thickness 3500 Å) were formed to complete the fabrication of the circuit. In this situation, the connection 321 at the portion 322 forms a capacitance with the connection 312 and is connected to the connection 313 through the contact 323. (FIGS. 3(F) and 4(C))

[Embodiment 3]

FIG. 5 shows the process according to this embodiment. FIG. 5 is a cross-sectional view illustrating the sequence of processing steps in the fabrication of a thin-film transistor. First, a silicon oxide base film 502 was formed over a substrate (Coning 7059) 501, and an amorphous silicon film was formed to a thickness of 1000 to 1500 Å in the shape of an island. Then, annealing was performed for 2 to 48 hours at temperatures 500 to 600° C. in a nitrogen or argon atmosphere to crystallize the amorphous silicon. An island of crystalline silicon 503 was thus formed. Further, a silicon oxide film 504 that was to act as a gate insulating film was deposited to a thickness of 1000 Å. After that, an aluminum film (thickness 5000 Å) containing 1 to 2% silicon was deposited by sputtering, and a photoresist was applied by spin coating. Next, patterning was performed using a known photolithographic process. Using a photoresist 506 formed by this process as a mask, anisotropic etching was performed by using a technique of reactive ion etching (RIE), to form an aluminum gate electrode/connection 505. (FIG. 5(A))

Then, the etching mode was switched to conventional plasma mode to perform isotropic etching. As a result, the sides of the aluminum gate electrode/connection were recessed. The amount of the gate electrode recess was controlled to 2000 to 3000 Å by adjusting the etching time. Next, impurities were introduced into the silicon film 503 by plasma doping, to form doped regions 507. (FIG. 5(B))

Next, the photoresist 506 was removed to expose the gate electrode/connection, and in this condition, activation was performed by radiating KrF excimer laser light. In this radiation step, the boundaries (indicated by X in FIG. 5(C)) between the doped regions and the active region were also exposed to laser radiation. (FIG. 5(C))

After that, the substrate was immersed in an ethylene glycol solution of tartaric acid, and the gate connection was anodized to form an anodic oxide 508 of 2000 to 2500 Å thickness on the surface thereof.

Finally, a silicon oxide film as an inter-layer insulator 509 was deposited to a thickness of 2000 to 5000 Å, and contact holes were opened to expose the doped regions. Then, connections/electrodes 510 each consisting of a multilayer film of tantalum nitride (thickness 500 Å) and aluminum (thickness 3500 Å) were formed to complete the fabrication of the thin-film transistor. (FIG. 5(E))

[Embodiment 4]

FIG. 6 shows the process according to this embodiment. A silicon oxide base film was formed over a substrate (Coning 7059) 601, and an amorphous silicon film was formed to a thickness of 1000 to 1500 Å in the shape of an island. Next, annealing was performed for 2 to 48 hours at temperatures 500 to 600° C. in a nitrogen or argon atmosphere to crystallize the amorphous silicon. An island of crystalline silicon 602 was thus formed. Further, a silicon oxide film 603 that was to act as a gate insulating film was deposited to a thickness of 1000 Å, and aluminum connections (thickness 5000 Å) 604, 605, and 608 were formed. (FIG. 6(A))

Furthermore, anodic oxides 607, 608, and 609 were formed over the surfaces of the connections 604 to 606, respectively. Next, using the thus processed connections as a mask, impurities were introduced into the silicon film 602 by plasma doping to form doped regions 610. (FIG. B(B))

Then, the aluminum connections 604 to 606 were etched off together with the anodic oxides, to expose the surface of the semiconductor region 602. In this condition, activation was performed by radiating KrF excimer laser light. (FIG. 6(C))

After that, aluminum connections 611, 612, and 613 were formed in the same pattern as that of the previously formed connections 604 to 606. Then, a polyimide film of 1 to 5 μm thickness was formed covering the connection 611. For the polyimide, a photosensitive polyimide material is preferable for use because of ease of patterning. (FIG. 6(D))

In this condition, electric current was applied to the connections 611 to 613 to form anodic oxides of 2000 to 2500 Å thickness, 615 and 616. However, the portion of the connection 611 covered with the polyimide was not anodized. (FIG. 6(E))

Finally, a silicon oxide film 617 as an inter-layer insulator was deposited to a thickness of 2000 to 5000 Å, and contact holes were opened to expose the doped regions 610. The inter-layer insulator deposited on a portion 620 of the connection 613 was completely removed to expose the anodic oxide 616. Then, connections/electrodes 618 and 619 each consisting of a multilayer film of tantalum nitride (thickness 500 Å) and aluminum (thickness 3500 Å) were formed to complete the fabrication of the circuit. In this situation, the connection 619 at the portion 620 and the connection 613 together form a capacitor with the anodic oxide 616 acting as the dielectric. (FIG. 6(F))

[Embodiment 5]

FIG. 7 shows the process according to this embodiment. This embodiment is concerned with the fabrication of a thin-film transistor on an insulating substrate. The substrate 701 shown is formed from glass; no-alkali glass, such as Coning 7059, or quartz or the like can be used to form the substrate. In this embodiment, a Coning 7059 substrate was used in consideration of the cost. A silicon oxide film 702 as the base oxide film was deposited over the substrate. Sputtering or chemical vapor deposition (CVD) techniques can be used to deposit the silicon oxide film. In this embodiment, deposition of this film was performed by plasma CVD using tetraethoxysilane (TEOS) and oxygen as the material gas. The substrate was heated to temperatures 200 to 400° C. The silicon oxide base film was deposited to a thickness of 500 to 2000 Å.

Next, an amorphous silicon film was deposited and patterned into an island shape. Plasma CVD and low-pressure CVD techniques are commonly used to deposit such an amorphous silicon film. In this embodiment, the amorphous silicon film was deposited by plasma CVD using monosilane ($SiH_4$) as the material gas. The amorphous silicon film was deposited to a thickness of 200 to 700 Å. This film was exposed to the radiation of laser light (KrF laser of wavelength 248 nm and pulse width 20 nsec). Prior to the laser radiation, the substrate was heated for 0.1 to 3 hours at temperatures 300 to 550° C. in a vacuum to extract the hydrogen contained in the amorphous silicon film. The laser's energy density was 250 to 450 mJ/$cm^2$. The substrate was held at temperatures 250 to 550° C. during the laser radiation. As a result, the amorphous silicon film was crystallized resulting in the formation of a crystalline silicon film 703.

Next, a silicon oxide film 704 that was to act as a gate insulating film was formed to a thickness of 800 to 1200 Å. In this embodiment, deposition of this film was accomplished by using the same method as employed for the formation of the silicon oxide base film 702. Then, a gate electrode 705 was formed using an anodizable material, for example, a metal such as aluminum, tantalum, or titanium, a semiconductor such as silicon, or a conductive metallic nitride such as tantalum nitride or titanium nitride. In this embodiment, aluminum was used to form the gate electrode 705 of 2000 to 10000 Å thickness. At this time, since the aluminum was patterned using phosphoric acid, the aluminum film was etched isotropically, resulting in the cross section shown in the figure. (FIG. 7(A))

After that, electric current was applied to this gate connection 705 to form a metal film 706 of 2000 to 2500 Å thickness on the surface thereof. This metal film was formed using means similar to a so-called electroplating process. Copper, nickel, chromium, zinc, tin, gold, silver, platinum, palladium, rhodium, etc. can be used as the material for the metal film. Of these, a material of easy etching is preferable. Chromium was used in this embodiment. First, chromic anhydride was dissolved in a 0.1–2% solution of sulfuric acid to produce a 1–30% solution. Then, the substrate was immersed in this solution, and the gate connection was connected to the cathode while a platinum electrode was used as the counter electrode (anode). In this condition, a current of 100 to 4000 A/$m^2$ was applied with the temperature held at 45 to 55° C.

After coating the surface of the gate connection with a chrome film by the above process, boron (B) or phosphorus (P) ions were introduced to form doped regions 707. The acceleration energy of the ions is usually set to match the thickness of the gate insulating film 704; typically, for the gate insulating film of 1000 Å thickness, appropriate acceleration energy was 50 to 65 keV for boron and 60 to 80 kev for phosphorus. A dose of $2\times10^{14}cm^{-2}$ to $6\times10^{15}cm^{-2}$ was found appropriate, and it was also found that at lower doses, a device of higher reliability can be obtained. Since the impurities were introduced with the chrome coating formed as described above, an offset was produced between the gate electrode (aluminum) and the doped regions. The profiles of the doped regions shown in the figure are only for illustrative purposes, and it is to be understood that in actuality the regions extend more or less outside the illustrated profiles because of ion scattering, etc. (FIG. 7(B))

After the impurity doping was completed, only the chrome film formed in the plating step was etched off. The substrate was immersed in an ethylene glycol solution of 1–5% tartaric acid, and the gate connection was connected to the anode while a platinum electrode was used as the cathode; in this condition, electric current was applied to oxidize and dissolve the chrome coating formed on the gate connection. Since the chromium dissolved in the solution adheres to the platinum electrode, the chromium is recovered for reuse, thus realizing a closed system that does not discharge harmful chromium to the outside. When the gate connection is completely stripped of the chromium, then the aluminum in the gate connection is subjected to anodic oxidation, but this can be suppressed by limiting the applied voltage. For example, when the applied voltage is limited to 10 V or less, anodic oxidation of the aluminum proceeds very little.

Figure 7A:
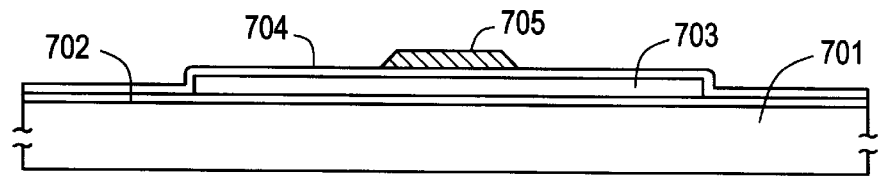
FIGS. 7(A) to 7(E) show an embodiment or the present invention. (Cross-sectional views)
Figure 7B:
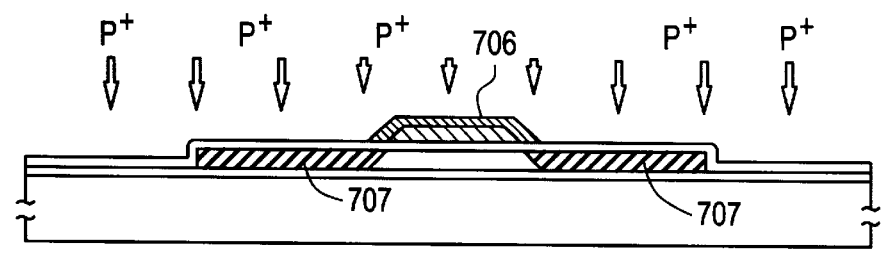
Figure 7C:
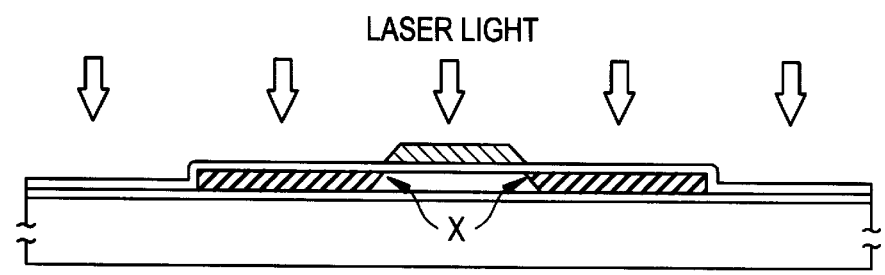
Figure 7D:
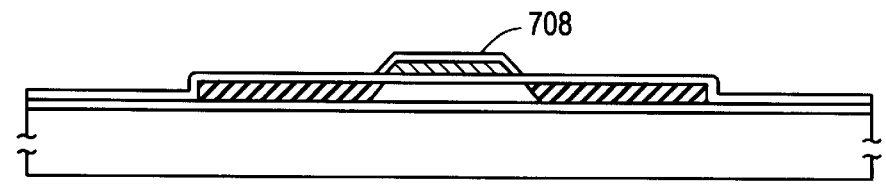
Figure 7E:
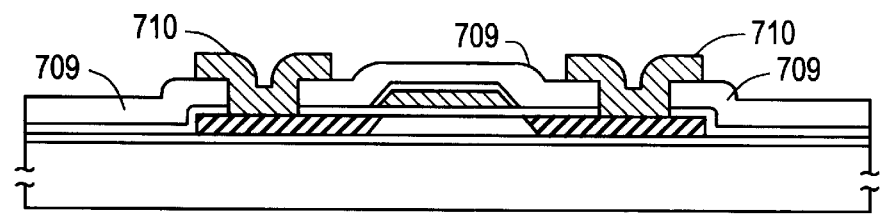
Figure 8A:
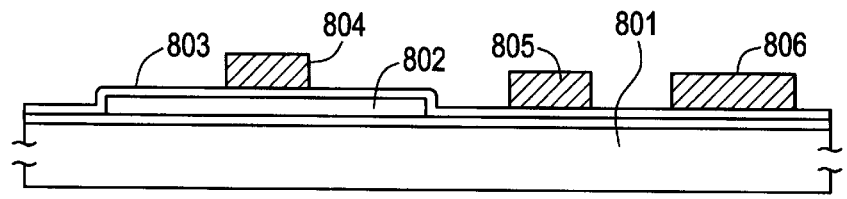
FIGS. 8(A) to 8(G) show an embodiment of the present invention. (Cross-sectional views)
Figure 8B:
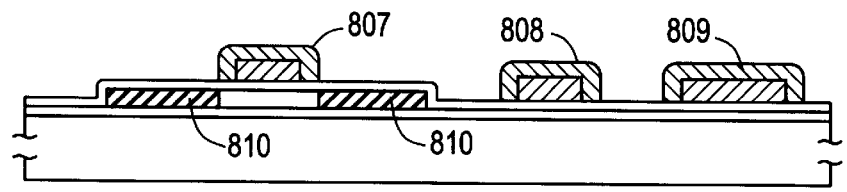
Figure 8C:
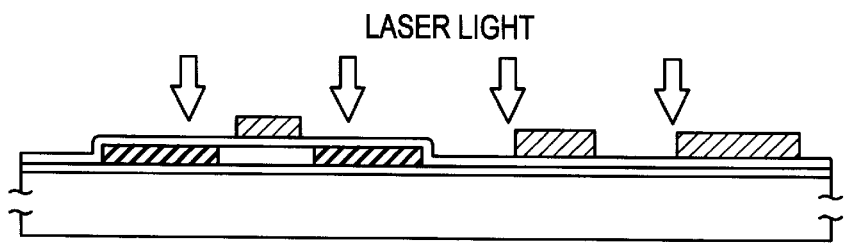
Figure 8D:
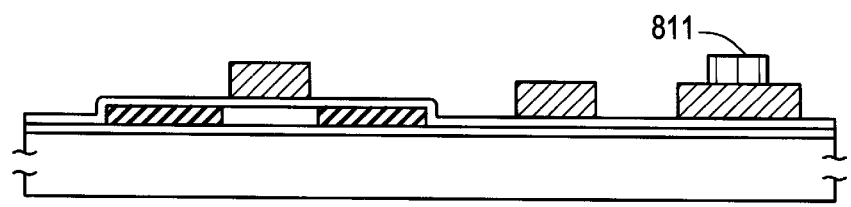
Figure 8E:
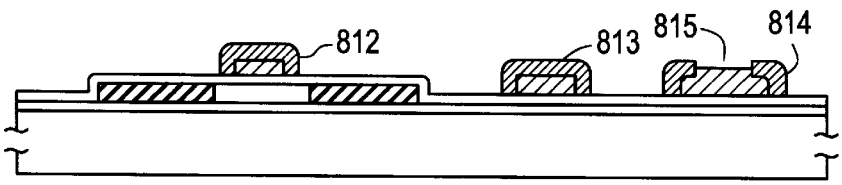
Figure 8F:
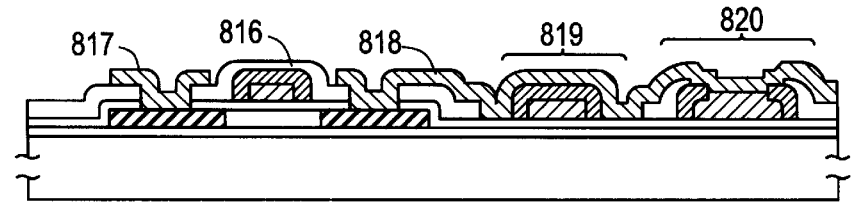
Figure 8G:
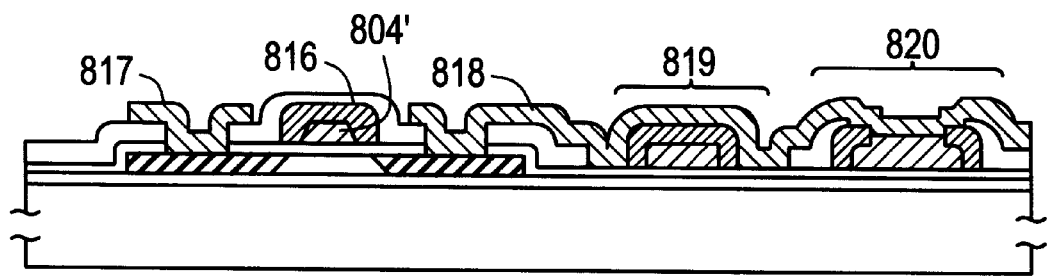

In this manner, only the chrome coating was etched off to expose the surface or the connection. As a result, the boundaries (indicated by X) between the doped regions 707 and the active region flanked by them were revealed as shown in FIG. 7(C). In this condition, laser radiation was performed to activate the doped regions. The laser used was a KrF excimer laser (wavelength 248 nm, pulse width 20 nsec), and the laser's energy density was 250–450 mJ/$cm^2$. More effective activation was obtained by holding the substrate at temperatures 250 to 550° C. during the laser radiation. Typically, for phosphorus-doped regions, a sheet resistance of 500 to 1000 $\Omega$/$cm^2$ was obtained with a dose of $1\times10^{15}cm^{-2}$, substrate temperature of 250° C., and laser energy of 300 mJ/$cm^2$. Furthermore, in this embodiment, since the boundaries between the doped regions and the active region are also exposed to laser radiation, the prior art fabrication problem of reduced reliability due to the degradation of the boundary portions is drastically alleviated. In this process step, since the laser light directly hits the exposed surface of the gate connection, it is desirable that the connection surface be capable of sufficiently reflecting the laser light or the connection itself be provided with sufficient heat resistance. In cases where sufficient surface reflectance cannot be provided, it is desirable that some provisions be made, such as, providing a heat resistant material on the upper surface. (FIG. 7(C))

After that, the gate electrode was anodized to form an anodic oxide 708 of 1500 to 2500 Å thickness on the surface thereof. To achieve the anodic oxidation, the substrate was immersed in an ethylene glycol solution of 1–5% citric acid, and all gate electrodes were combined to form the positive electrode while a platinum was used to form the negative electrode; in this condition, the applied voltage was increased at a rate of 1 to 5 volts per minute. The anodic oxide 708 not only determines the amount of the offset of the thin-film transistor because the conductive surface becomes recessed by the anodic oxidation process, but also serves to prevent shorting to upper connections; therefore, it is only necessary for the oxide to have the thickness that can achieve the purpose, and depending on cases, the formation of such an anodic oxide may not be necessary. (FIG. 7(D))

Finally, a silicon oxide film 709 as an inter-layer insulator was formed to a thickness of 2000 to 1000 Å by plasma CVD using, for example, TEOS as the material gas, and this film was opened in a window pattern, through which electrodes 710, each consisting of a multilayer film of metal or other materials e.g. a multilayer film comprising a titanium nitride of 200 Å thickness and an aluminum of 5000 Å thickness, were formed for connection to the doped regions, thus completing the fabrication of the thin-film transistor. (FIG. 7(E))

[Embodiment 6]

Figure 9A:
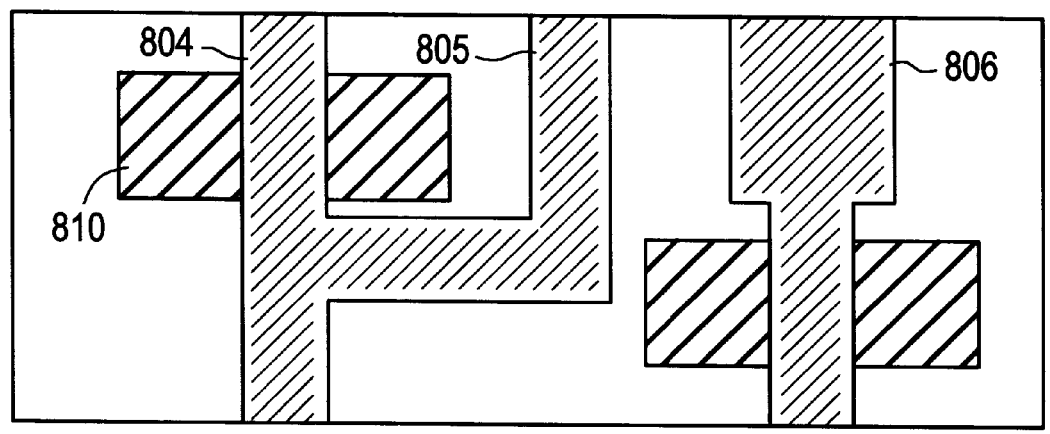
FIGS. 9(A) to 9(C) show an embodiment of the present invention. (Top plan views)
Figure 9B:
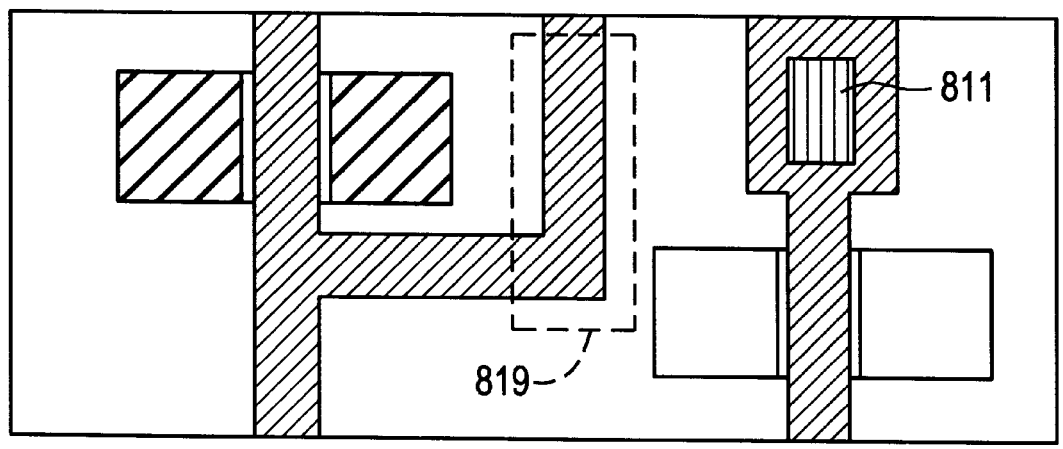
Figure 9C:
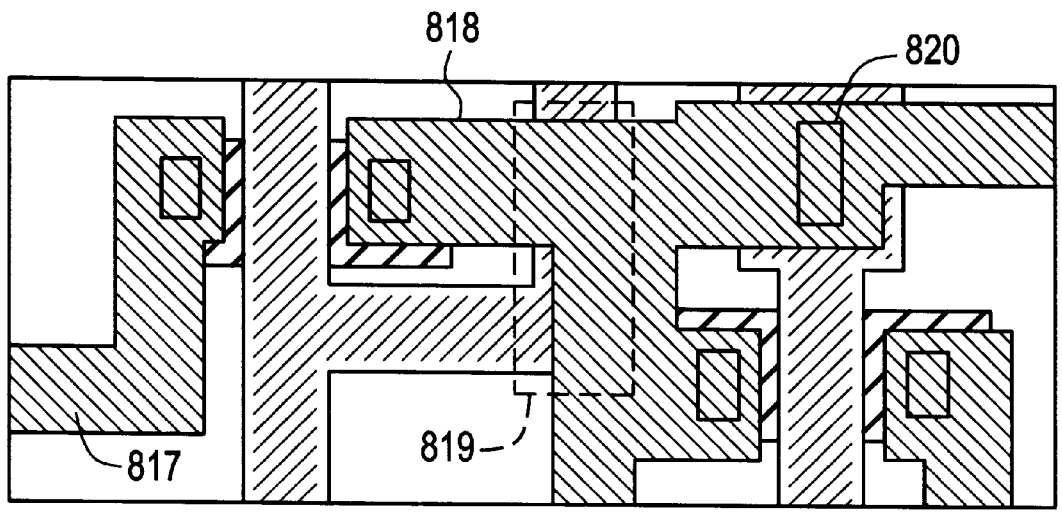
Figure 10A:
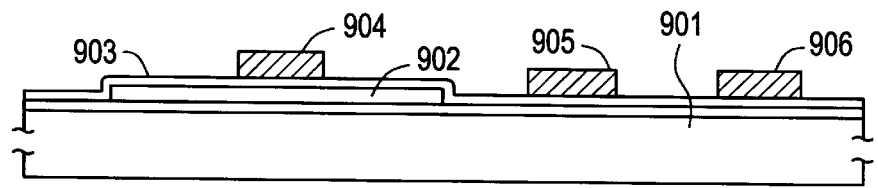
FIGS. 10(A) to 10(F) show an embodiment of the present invention. (Cross-sectional views)
Figure 10B:
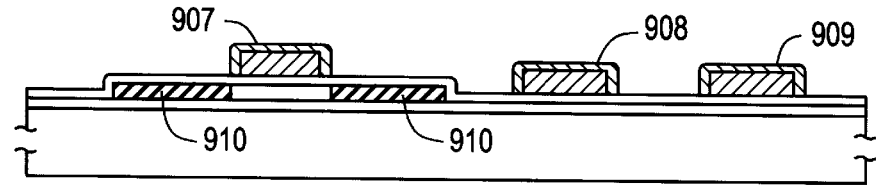
Figure 10C:
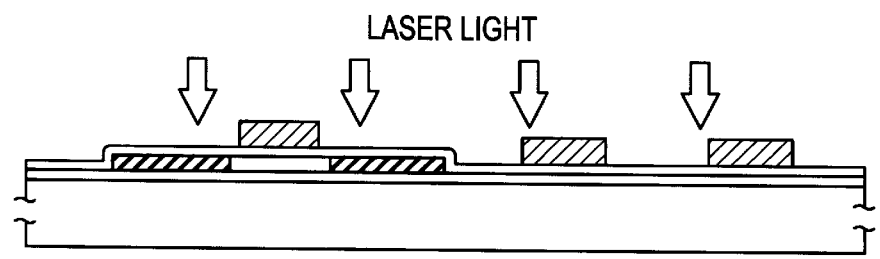
Figure 10D:
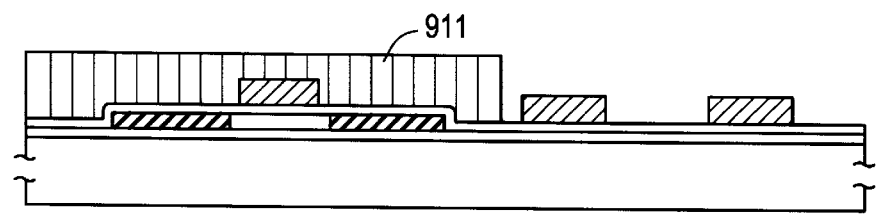
Figure 10E:
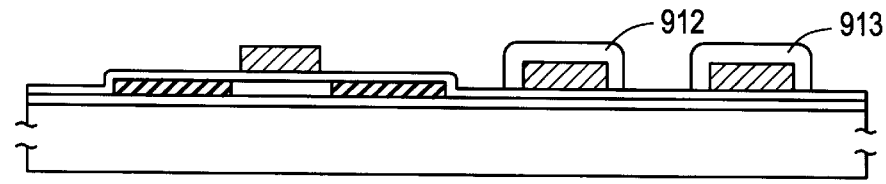
Figure 10F:
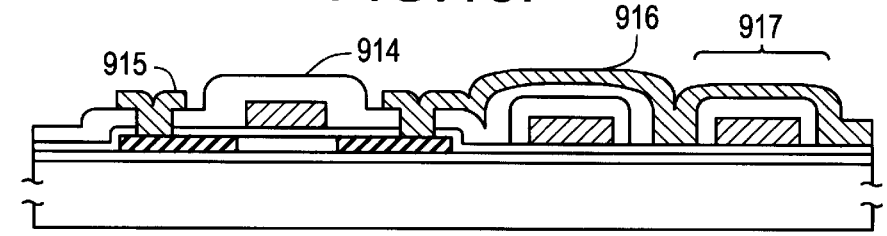

FIGS. 8 and 9 show the process according to this embodiment. FIG. 8 is a cross-sectional view taken along a dashed line in FIG. 9 (top plan view). First, a silicon oxide base film was formed over a substrate (Coning 7059) 801, and an amorphous silicon film was formed to a thickness of 1000 to 1500 Å. Then, annealing was performed for 24 to 48 hours at 600° C. in a nitrogen or argon atmosphere to crystallize the amorphous silicon. An island of crystalline silicon 802 was thus formed. Further, a silicon oxide film 803 that was to act as a gate insulating film was deposited to a thickness of 1000 Å, on which were formed aluminum connections (thickness 5000 Å) 804, 805, and 806. (FIG. 8(A))

Then, the substrate was immersed in an electrolyte, and electric current was applied to these connections 804 to 806 to form chrome coatings of 2000 to 2500 Å thickness, 807, 808, and 809, on the respective surfaces thereof. Using the thus processed connections as a mask, impurities were introduced into the silicon film 802 by plasma doping, thus forming doped regions 810. (FIGS. 8(B) and 9(A))

Next, only the chrome coatings 807 to 809 were etched off to expose the surfaces of the connections; in this condition, activation was performed by radiating KrF excimer laser light. (FIG. 8(C))

After that, a polyimide film 811 of 1 to 5 μm thickness was formed only on the portion of the connection 806 where a contact hole was to be formed. For the polyimide, a photosensitive polyimide material is preferable for use because of ease of patterning. (FIGS. 8(D) and 9(B))

In this condition, the substrate was immersed in an electrolyte, and electric current was applied to the connections 804 to 806 to form anodic oxides of 2000 to 2500 Å thickness, 812, 813, and 814. However, the portion on which the polyimide was previously formed was not anodized but left with a contact hole 815. (FIG. 8(E))

Finally, a silicon oxide film 816 of 2000 to 5000 Å thickness was deposited as an inter-layer insulator, through which contact holes were opened. The inter-layer insulator deposited on a portion of the connection 805 (the portion inside the dotted line in FIG. 9(C)) was completely removed to expose the underlying anodic oxide 813. Then, connections/electrodes 817 and 818 each consisting of a multilayer film of tantalum nitride (thickness 500 Å) and aluminum (thickness 3500 Å) were formed to complete the fabrication of the circuit. In this situation, the connection 818 at the portion 819 forms a capacitance with the connection 805 and is connected to the connection 806 through the contact 820. (FIGS. 8(F) and 9(C)).

[Embodiment 7]

FIG. 10 shows the process according to this embodiment. A silicon oxide base film was formed over a substrate (Coning 7059) 901, and an amorphous silicon film was formed to a thickness of 1000 to 1500 Å. Next, annealing was performed for 24 to 48 hours at 600° C. in a nitrogen or argon atmosphere to crystallize the amorphous silicon. An island of crystalline silicon 902 was thus formed. Further, a silicon oxide film 903 that was to act as a gate insulating film was deposited to a thickness of 1000 Å, and tantalum connections (thickness 5000 Å) 904, 905, and 906 were formed. (FIG. 10(A))

Then, chrome coatings 907, 908, and 909 of 500 to 1500 Å thickness were formed by electroplating on the surfaces of these connections. Using the thus processed connections as a mask, impurities were introduced into the silicon film 902 by plasma doping, thus forming doped regions 910. (FIG. 10(B))

Next, only the chrome coatings 907 to 909 were etched off to expose the boundaries between the doped regions 910 and the active region flanked by them. In this condition, activation was performed by radiating KrF excimer laser light. (FIG. 10(C))

After that, a polyimide film 911 of 1 to 5 μm thickness was formed covering the connection 904. For the polyimide, a photosensitive polyimide material is preferable for use because of ease of patterning. (FIG. 10(D))

In this condition, electric current was applied to the connections 904 to 906 immersed in an electrolyte, to form anodic oxides 912 and 913 of 2000 to 2500 Å thickness. However, the portion of the connection 904 covered with the polyimide was not anodized. (FIG. 10(E))

Finally, a silicon oxide film 914 as an inter-layer insulator was deposited to a thickness of 2000 to 5000 Å, and contact holes were opened to expose the doped regions 910. The inter-layer insulator deposited on a portion of the connection 906 was completely removed to expose the anodic oxide 913. Then, connections/electrodes 915 and 916 each consisting of a multilayer film of titanium nitride (thickness 500 Å) and aluminum (thickness 3500 Å) were formed to complete the fabrication of the circuit. In this situation, the connection 916 at the portion 917 and the connection 906 together form a capacitor with the anodic oxide 913 acting as the dielectric. (FIG. 5(F))

Thus, the present invention is effective in enhancing the reliability of MIS semiconductor devices, such as MOS transistors and thin-film transistors, fabricated by a low-temperature process. In a specific example, when the device was stored for more than 10 hours with its source grounded and with its drain or gate or both subjected to a voltage of +20 V or over or −20 V or less, there were observed no significant effects on the transistor characteristics.

The description of the embodiments has been given centering on thin-film transistors, but it will be appreciated that the effect of the invention can also be obtained for other MIS semiconductor devices fabricated on single-crystal semiconductor substrates. Furthermore, besides silicon used in the above embodiments, such semiconductor materials as silicon-germanium alloys, silicon carbide, germanium, cadmium selenide, cadmium sulfide, gallium arsenide, etc. can be used to obtain the same effect as described above.

The present invention thus provides advantages in industrial use.

What is claimed is:

1. A semiconductor device comprising:
   a semiconductor layer comprising crystalline silicon formed on an insulating surface;
   a gate insulating film formed on said semiconductor layer;
   a gate electrode formed over said semiconductor layer with said gate insulating film interposed therebetween;
   a channel forming region formed in said semiconductor layer below said gate electrode;
   a pair of impurity regions formed in said semiconductor layer with said channel forming region therebetween,
   wherein said gate electrode has sloped side surfaces, and boundaries between said channel forming region and said pair of impurity regions extend in parallel with said sloped side surfaces of the gate electrode throughout a thickness of said semiconductor layer.

2. The semiconductor device according to claim 1 wherein said gate electrode comprises a material selected from aluminum, titanium, tantalum, silicon, tungsten and molybdenum.

3. The semiconductor device according to claim 1 wherein said pair of impurity regions are offset from said gate electrode.

4. The semiconductor device according to claim 1 wherein a portion of the channel forming region extends beyond side edges of the gate electrode.

5. A semiconductor device comprising:
   a semiconductor layer comprising crystalline silicon formed on an insulating film comprising silicon oxide;
   a gate insulating film comprising silicon oxide formed on said semiconductor layer;
   a gate electrode formed over said semiconductor layer with said gate insulating film interposed therebetween;
   a channel forming region formed in said semiconductor layer below said gate electrode;
   a pair of impurity regions formed in said semiconductor layer with said channel forming region therebetween,
   wherein said gate electrode has sloped side surfaces, and boundaries between said channel forming region and said pair of impurity regions extend in parallel with said sloped side surfaces of the gate electrode throughout a thickness of said semiconductor layer.

6. The semiconductor device according to claim 5 wherein said gate electrode comprises a material selected from aluminum, titanium, tantalum, silicon, tungsten and molybdenum.

7. The semiconductor device according to claim 5 wherein said pair of impurity regions are offset from said gate electrode.

8. The semiconductor device according to claim 5 wherein a portion of the channel forming region extends beyond side edges of the gate electrode.

9. A semiconductor device comprising:
   a semiconductor layer comprising crystalline silicon formed on an insulating surface, said semiconductor layer having a thickness of 200 to 700 Å;
   a gate insulating film formed on said semiconductor layer;
   a gate electrode formed over said semiconductor layer with said gate insulating film interposed therebetween;
   a channel forming region formed in said semiconductor layer below said gate electrode;
   a pair of impurity regions formed in said semiconductor layer with said channel forming region therebetween,
   wherein said gate electrode has sloped side surfaces, and boundaries between said channel forming region and said pair of impurity regions extend in parallel with said sloped side surfaces of the gate electrode throughout a thickness of said semiconductor layer.

10. The semiconductor device according to claim 9 wherein said gate electrode comprises a material selected from aluminum, titanium, tantalum, silicon, tungsten and molybdenum.

11. The semiconductor device according to claim 9 wherein said pair of impurity regions are offset from said gate electrode.

12. The semiconductor device according to claim 9 wherein a portion of the channel forming region extends beyond side edges of the gate electrode.

13. A semiconductor device comprising:
    a semiconductor layer comprising crystalline silicon formed on an insulating surface over a substrate;
    a gate insulating film formed on said semiconductor layer;
    a gate electrode formed over said semiconductor layer with said gate insulating film interposed therebetween;
    a channel forming region formed in said semiconductor layer below said gate electrode;
    a pair of impurity regions formed in said semiconductor layer with said channel forming region therebetween,
    wherein said gate electrode has sloped side surfaces, and boundaries between said channel forming region and said pair of impurity regions extend obliquely with respect to a plane of said substrate throughout a thickness of said semiconductor layer.

14. The semiconductor device according to claim 13 wherein said gate electrode comprises a material selected from aluminum, titanium, tantalum, silicon, tungsten and molybdenum.

15. The semiconductor device according to claim 13 wherein said pair of impurity regions are offset from said gate electrode.

16. The semiconductor device according to claim 13 wherein a portion of the channel forming region extends beyond side edges of the gate electrode.

17. A semiconductor device comprising:
    a substrate;
    an insulating film comprising silicon oxide formed over said substrate;
    a semiconductor layer comprising crystalline silicon formed on said insulating film;
    a gate insulating film comprising silicon oxide formed on said semiconductor layer;
    a gate electrode formed over said semiconductor layer with said gate insulating film interposed therebetween;
    a channel forming region formed in said semiconductor layer below said gate electrode;
    a pair of impurity regions formed in said semiconductor layer with said channel forming region therebetween,
    wherein said gate electrode has sloped side surfaces, and boundaries between said channel forming region and said pair of impurity regions extend obliquely with respect to a plane of said substrate throughout a thickness of said semiconductor layer.

18. The semiconductor device according to claim 17 wherein said gate electrode comprises a material selected from aluminum, titanium, tantalum, silicon, tungsten and molybdenum.

19. The semiconductor device according to claim 17 wherein said pair of impurity regions are offset from said gate electrode.

20. The semiconductor device according to claim 12 wherein a portion of the channel forming region extends beyond side edges of the gate electrode.

21. A semiconductor device comprising:
- a semiconductor layer comprising crystalline silicon formed on an insulating surface over a substrate, said semiconductor layer having a thickness of 200 to 700 Å;
- a gate insulating film formed on said semiconductor layer;
- a gate electrode formed over said semiconductor layer with said gate insulating film interposed therebetween;
- a channel forming region formed in said semiconductor layer below said gate electrode;
- a pair of impurity regions formed in said semiconductor layer with said channel forming region therebetween, wherein said gate electrode has sloped side surfaces, and boundaries between said channel forming region and said pair of impurity regions extend obliquely with respect to a plane of said substrate throughout a thickness of said semiconductor layer.

22. The semiconductor device according to claim 21 wherein said gate electrode comprises a material selected from aluminum, titanium, tantalum, silicon, tungsten and molybdenum.

23. The semiconductor device according to claim 21 wherein said pair of impurity regions are offset from said gate electrode.

24. The semiconductor device according to claim 21 wherein a portion of the channel forming region extends beyond side edges of the gate electrode.

* * * * *